(12) United States Patent
Wang et al.

(10) Patent No.: US 6,314,550 B1
(45) Date of Patent: Nov. 6, 2001

(54) CASCADED PROGRAMMING WITH MULTIPLE-PURPOSE PINS

(75) Inventors: Bonnie Wang, Cupertino; Chiakang Sung, Milpitas; Khai Huang; Khai Nguyen, both of San Jose; Xiaobao Wang, Santa Clara, all of CA (US)

(73) Assignee: Altera Corporation, San Jose, CA (US)

( * ) Notice: Subject to any disclaimer, the term of this patent is extended or adjusted under 35 U.S.C. 154(b) by 0 days.

(21) Appl. No.: 09/094,226

(22) Filed: Jun. 9, 1998

Related U.S. Application Data

(60) Provisional application No. 60/050,953, filed on Jun. 13, 1997, provisional application No. 60/049,478, filed on Jun. 13, 1997, provisional application No. 60/052,990, filed on Jun. 10, 1997, provisional application No. 60/049,275, filed on Jun. 10, 1997, provisional application No. 60/049,247, filed on Jun. 10, 1997, provisional application No. 60/049,246, filed on Jun. 10, 1997, provisional application No. 60/049,245, filed on Jun. 10, 1997, and provisional application No. 60/049,243, filed on Jun. 10, 1997.

(51) Int. Cl.[7] .................................................. G06F 17/10
(52) U.S. Cl. ............................................. 716/17; 716/16
(58) Field of Search ........................ 716/17, 16; 326/38, 326/37, 39, 40

(56) References Cited

U.S. PATENT DOCUMENTS

| 3,761,695 | 9/1973 | Eichelberger | ................... 235/13 AC |
| 3,783,254 | 1/1974 | Eichelberger | ........................ 235/152 |

(List continued on next page.)

FOREIGN PATENT DOCUMENTS

WO 97/06599  2/1997 (WO) ........................... H03K/19/177

OTHER PUBLICATIONS

Altera Corporation, Data Sheet, "Flex 10K Embedded Programmable Logic Family," Jul., 1995, ver. 1, pp. 1–39.
Altera Corporation, Data Sheet, "Flex 8000 Programmable Logic Device Family," Aug. 1994, ver. 4, pp. 1–22.
Altera Corporation, Data Sheet, "Max 7000 Programmable Logic Device Family," Jun. 1996, ver. 4, pp. 193–261.
Altera Corporation, Application Note 39, "JTAG Boundary–Scan Testing In Altera Devices," Nov., 1995, ver. 3, pp. 1–28.
IEEE Computer Society, "IEEE Standard Test Access Port and Boundary–Scan Architecture (IEEE STd 1149.1–1990)," Institute of Electrical and Electronics Engineers, Inc., New York, NY, Oct. 21, 1993, pp. 1–1 to 12–6 and Appendix A–1 to A–12.
IEEE Computer Society, "Supplement to (IEEE Std 1149.1–1990), IEEE Standard Test Access Port and Boundary–Scan Architecture (IEEE Std 1149.1b–1994)," Institute of Electrical and Electronics Engineers, Inc., New York, NY, Mar. 1, 1995, pp. 1–67.
Xilnix Corporation, "The Programmable Logic Data Book," 1993, pp. 1–1 to 10–8.
Xilnix Corporation, "The Programmable Logic Data Book," Section 9, 1994, pp. 9–1 to 9–32.

(List continued on next page.)

Primary Examiner—Matthew S. Smith
Assistant Examiner—Vuthe Siek
(74) Attorney, Agent, or Firm—Townsend and Townsend and Crew LLP

(57) ABSTRACT

A technique to provide higher system performance by increasing amount of data that may be transferred in parallel is to increase the number of external pins available for the input and output of user data (user I/O). A technique is to allow a pin to be used for multiple purposes, a dedicated operation during a first mode and for user I/O during other modes. A pin (515) may be used to perform a handshaking function during a configuration mode and user I/O during a normal or user mode. The technique may be used during the cascaded configuration of programmable integrated circuits, and in conjunction with in-system programming.

50 Claims, 6 Drawing Sheets

U.S. PATENT DOCUMENTS

| | | | |
|---|---|---|---|
| 3,806,891 | 4/1974 | Eichelberger et al. | 340/172.5 |
| 4,488,259 | 12/1984 | Mercy | 364/900 |
| 4,667,325 | 5/1987 | Kitano et al. | 371/25 |
| 4,701,920 | 10/1987 | Resnick et al. | 371/25 |
| 5,175,859 | 12/1992 | Miller et al. | 395/800 |
| 5,336,951 | 8/1994 | Josephson et al. | 307/465 |
| 5,355,369 | 10/1994 | Greenbergerl et al. | 371/22.3 |
| 5,361,373 | 11/1994 | Gilson | 395/800 |
| 5,473,758 * | 12/1995 | Allen et al. | 711/103 |
| 5,489,858 | 2/1996 | Pierce et al. | 326/56 |
| 5,491,666 | 2/1996 | Sturges | 365/201 |
| 5,581,564 | 12/1996 | Miller et al. | 371/22.3 |
| 5,590,305 | 12/1996 | Terrill et al. | 395/430 |
| 5,594,367 | 1/1997 | Trimberger et al. | 326/41 |
| 5,644,496 | 7/1997 | Agrawal et al. | 364/489 |
| 5,650,734 | 7/1997 | Chu et al. | 326/38 |
| 5,686,844 * | 11/1997 | Hull et al. | 326/38 |
| 5,734,868 | 3/1998 | Curd et al. | 395/500 |
| 5,737,567 | 4/1998 | Whittaker et al. | 395/430 |
| 5,819,050 * | 10/1998 | Boehling et al. | 710/104 |
| 5,831,448 * | 11/1998 | Kean | 326/41 |
| 5,841,867 | 11/1998 | Jacobson et al. | 380/25 |
| 5,869,979 * | 2/1999 | Bocchino | 326/38 |
| 6,031,391 * | 2/2000 | Couts-Martin et al. | 326/38 |

OTHER PUBLICATIONS

Xilnix Corporation, "The Programmable Logic Data Book," Product Description, "XC2000 Logic Cell Array Families," Aug. 1994, pp. 2–187 to 2–216.

Xilnix Corporation, "The Programmable Logic Data Book," Product Description, "XC3000, XC3000A, XC000L, SC3100, XC3100A Logic Cell Array Families," pp. 2–105 to 2–152.

Xilnix Corporation, "The Programmable Logic Data Book," Product Specification, "XC4000 Series Field Programmable Gate Arrays," Jul. 30, 1996, version 1.03, pp. 4–5 to 4–76.

AT&T Microelec. Advance Data Sheet, Optimized Reconfigurable Cell Array (ORCA) Series Field–Programmable Gate Arrays, Feb. 1993.

Altera Corporation, Application Note 38, "Configuring Multiple FLEX 8000 Devices," May 1994.

Altera Corporation, Application Note 33, "Configuring FLEX 8000 Devices," May 1994.

* cited by examiner

CASCADED PROGRAMMING WITH MULTIPLE-PURPOSE PINS

This application claims the benefit of a U.S. provisional application Nos. 60/049,275, filed Jun. 10, 1997; 60/049,478, filed Jun. 12, 1997; 60/049,246, filed Jun. 10, 1997; 60/052,990, filed Jun. 10, 1997; 60/049,247, filed Jun. 10, 1997; 60/049,243, filed Jun. 10, 1997; 60/050,953, filed Jun. 13, 1997; and 60/049,245, filed Jun. 10, 1997, all of which are incorporated herein by reference.

BACKGROUND OF THE INVENTION

The present invention relates to the field of integrated circuits, and more specifically to techniques to effectively provide greater number of external pins for input and output of data.

Semiconductor technology continues to improve. This technology allows greater and greater functionality to be provided by a single integrated circuit or "chip." Signals are input to and output from the chip using external pins or pads. The chip interfaces to external circuitry, possibly on other chips, using the external pins.

The performance of a system depends in part on the amount or rate at which data can be transferred on and off the chip. This transfer rate may be referred to as the data bandwidth. One technique for increasing system performance is to provide more rapid transfer rates. This may be accomplished by improvements in process technology or circuit design. Another technique to increase system performance is to transfer a greater amount of data at one time (or "in parallel"). Therefore, for greater performance, it is important there are many external pins available for input and output of user data.

In an integrated circuit, certain pins are sometimes dedicated to functions other than user data I/O. For example, in a programmable integrated circuit or device such as a PLD or FPGA, some pins may be dedicated to the programming and testing (such as JTAG boundary scan testing) of the device. These dedicated external pin reduce the number of pins available for user I/O. The performance of the chip may be detrimentally affected since not as many user I/O signals may be transferred in parallel. Other programmable devices may include integrated circuits such as microprocessors, coprocessors, microcontrollers, programmable controllers or sequencers, graphics controllers, memories, DRAMs, SRAMs, EPROMs, serial EPROMs, Flash memories, and many others.

Consequently, there is a need for techniques of effectively providing greater number of external pins for input and output to obtain higher performance. Specifically, there is a need for techniques to reduce the number of external pins dedicated to functions other than user I/O, which would make greater number of external pins available for the input and output of user data.

SUMMARY OF THE INVENTION

The present invention is a technique to provide higher system performance by increasing the amount of data that may be transferred in parallel by increasing the available number of external pins available for the input and output of user data (user I/O). One technique is to allow pins to be used for multiple purposes. For example, a dedicated pin may be used for handshaking purpose during configuration of a programmable integrated circuit. This same pin may be used for user I/O during a normal or user mode, or after configuration of the programmable integrated circuit has been completed. By making this dedicated pin available for user I/O, this effectively increases the number of I/O pins.

The technique of the present invention may be software or hardware control, or both. For software control, a user may select a dual-function pin to be used only as user I/O since the function (such as handshaking) is not needed. The user encodes this in a configuration file such as a POF file. Hardware control may be used to automatically release a pin to be used for user I/O after its dedicated purpose has been completed.

Dual-function pin may be especially useful for programmable integrated circuits such as PLDs which can be configured by cascaded programming. During cascaded programming, some pins of the integrated circuit are used for a handshaking function. When programming or configuration is completed, the present inventions allows those handshaking pins to be used as regular I/O pins. Furthermore, the particular programmable integrated may be configured without using cascaded programming. In that case, the handshaking pins are not needed, and the present invention will allow these pins to be used as regular I/O pins. Therefore, an aspect of the present invention is to permit the programming of cascaded programming integrated circuits without the requirement of having dedicated pins for handshaking.

The advantages of providing dual-purpose pins in a programmable integrated circuit include saving device package costs and leaving space for more user I/Os. Overall, this increases the available functionality and value of the devices. There is relatively little cost to implement the circuits to implement dual-mode input and output pins in a programmable integrated circuit.

An aspect of the present invention is the use of an external pin of an integrated circuit to be a configuration pin or an I/O pin. A further aspect to use a pin as a handshaking pin during the configuration of a programmable integrated circuit, and to use the same pin as a user I/O pin when the programmable integrated circuit is not being configured. An aspect of the present invention is the use of circuitry on a programmable integrated circuit to permit at least two modes of operation for an external pin, where one of the modes of operation is related to configuration of the programmable integrated circuit.

In a specific embodiment, the present invention is a method of configuring programmable devices. A source of configuration data is provided. A first pin of a first programmable device is configured to be used to output a handshaking signal. A second pin of a second programmable device is configured to be used to receive the handshaking signal. The first and second programmable devices are configured using the configuration data. Furthermore, after the first programmable device has been configured, the first pin is permitted to be used as a user I/O pin.

In a further embodiment, the present invention is a programmable integrated circuit including first circuitry to configure a first pin as a configuration input pin in a first state and a first user I/O pin in a second state. There is second circuitry to configure a second pin as a configuration output pin in the first state and a second user I/O pin in the second state.

The first circuitry may include a NOR gate having a first input coupled to the first pin and a second input coupled to a state signal configuring the first pin will be in the first or second state; an input buffer coupled to the first pin; and an output buffer coupled to the first pin. The second circuitry may include a multiplexer having a first input coupled to a configuration output logic circuit and a second input coupled to a user mode output circuit; and a tristate buffer coupled between an output of the multiplexer and the second pin.

In a still further embodiment, the present invention includes a method of configuring programmable devices. A first programmable device with a first pin configurable as a special purpose pin or a user I/O pin is provided. A second programmable device with a second pin configurable as a special purpose pin or a user I/O pin is provided. During a first mode, the first pin is configured to be a special purpose pin to output a handshaking signal. During the first mode, the second pin is configured as a special purpose pin to receive the handshaking signal from the first pin. The first and second programmable devices are configured. In a second mode, the first pin is configured to be a user I/O pin. In a second mode, the second pin is configured to be a user I/O pin.

Other objects, features, and advantages of the present invention will become apparent upon consideration of the following detailed description and the accompanying drawings, in which like reference designations represent like features throughout the figures.

DESCRIPTION OF THE SPECIFIC EMBODIMENTS

Figure 1:
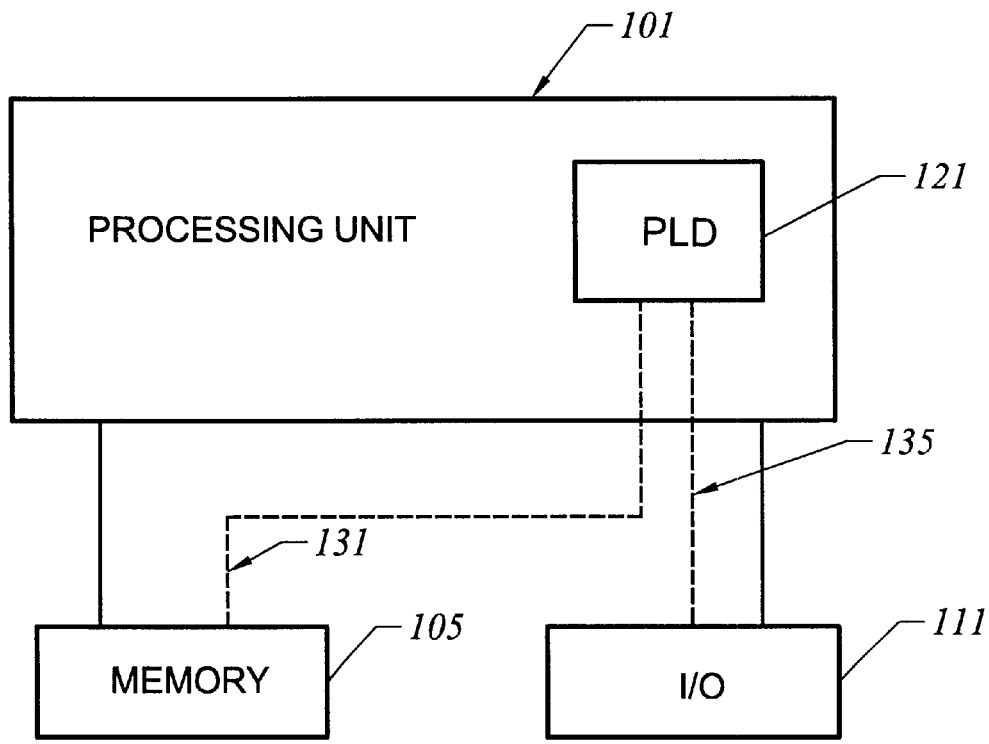
FIG. 1 shows a digital system incorporating a programmable logic device.

FIG. 1 shows a block diagram of a digital system. The system may be provided on a single board, on multiple boards, or even within multiple enclosures linked by electrical conductors or a network (e.g., a local area network or the internet). This digital system may be used in a wide variety of applications and industries including networking, telecommunications, automotive, control systems, consumer electronics, computers, workstations, military, industrial, digital processing, and many others. In the embodiment of FIG. 1, a processing unit 101 is coupled to a memory 105 and an I/O 111. Further, a programmable logic device (PLD) 121 is incorporated within this digital system. PLD 121 may be specially coupled to memory 105 through connection 131 and to I/O 111 through connection 135.

Programmable logic devices (PLDs) are sometimes also referred to as PALs, PLAs, FPLAs, CPLDs, EPLDs, EEPLDs, LCAs, or FPGAs. PLDs are well-known integrated circuits that provide the advantages of fixed integrated circuits with the flexibility of custom integrated circuits. Such devices allow a user to electrically program standard, off-the-shelf logic elements to meet a user's specific needs. See, for example, U.S. Pat. No. 4,617,479, incorporated herein by reference for all purposes. Such devices are currently represented by, for example, Altera's MAX® and FLEX® series of devices. The former are described in, for example, U.S. Pat. Nos. 5,241,224 and 4,871,930, and the *Altera Data Book,* Jun. 1996, all incorporated herein by reference in their entirety for all purposes. The latter are described in, for example, U.S. Pat. Nos. 5,258,668, 5,260,610, 5,260,611, and 5,436,575, and the *Altera Data Book,* Jun. 1996, all incorporated herein by reference in their entirety for all purposes.

Processing unit 101 may direct data to an appropriate system component for processing or storage, execute a program stored in memory 105 or input using I/O 111, or other similar function. Processing unit 101 may be a central processing unit (CPU), microprocessor, floating point coprocessor, graphics coprocessor, hardware controller, microcontroller, programmable logic device programmed for use as a controller, or other processing unit. Memory 105 may be a random access memory (RAM), read only memory (ROM), fixed or flexible disk media, PC Card flash disk memory, tape, or any other storage retrieval means, or any combination of these storage retrieval means. PLD 121 may serve many different purposes within the system in FIG. 1. PLD 121 may be a logical building block of processing unit 101, supporting its internal and external operations. PLD 121 is programmed or configured to implement the logical functions necessary to carry on its particular role in system operation.

In a PLD, the number of available external pins limits the amount of data that may be input and output of the PLD at the same time. The number of available external pins depends in part on the size and configuration of the package selected. Although larger package sizes provide greater numbers of external pins, it may not be desirable to use a larger package size since it will be more expensive, use more board space, and may have increased parasitics. Therefore, it is important to maximally use the available external pins for a given package.

There are various techniques for configuring programmable logic devices to perform the functions desired by the users. For example, Altera's FLEX® 8000 and 10K devices are SRAM-based devices, and these devices are configured upon power-up because they do not have nonvolatile storage. Some descriptions of configuring programmable integrated circuits such as PLDs is found in U.S. Pat. No. 5,590,305, Altera Corp., Application Note 38, "Configuring Multiple FLEX 8000 Devices," May 1994, and Altera Corp., Application Note 33, "Configuring FLEX 8000 Devices," May 1994, all of which are incorporated herein by reference. Additional information on configuration of PLDs may be found in the *Altera Data Book 1996.*

Figure 2:
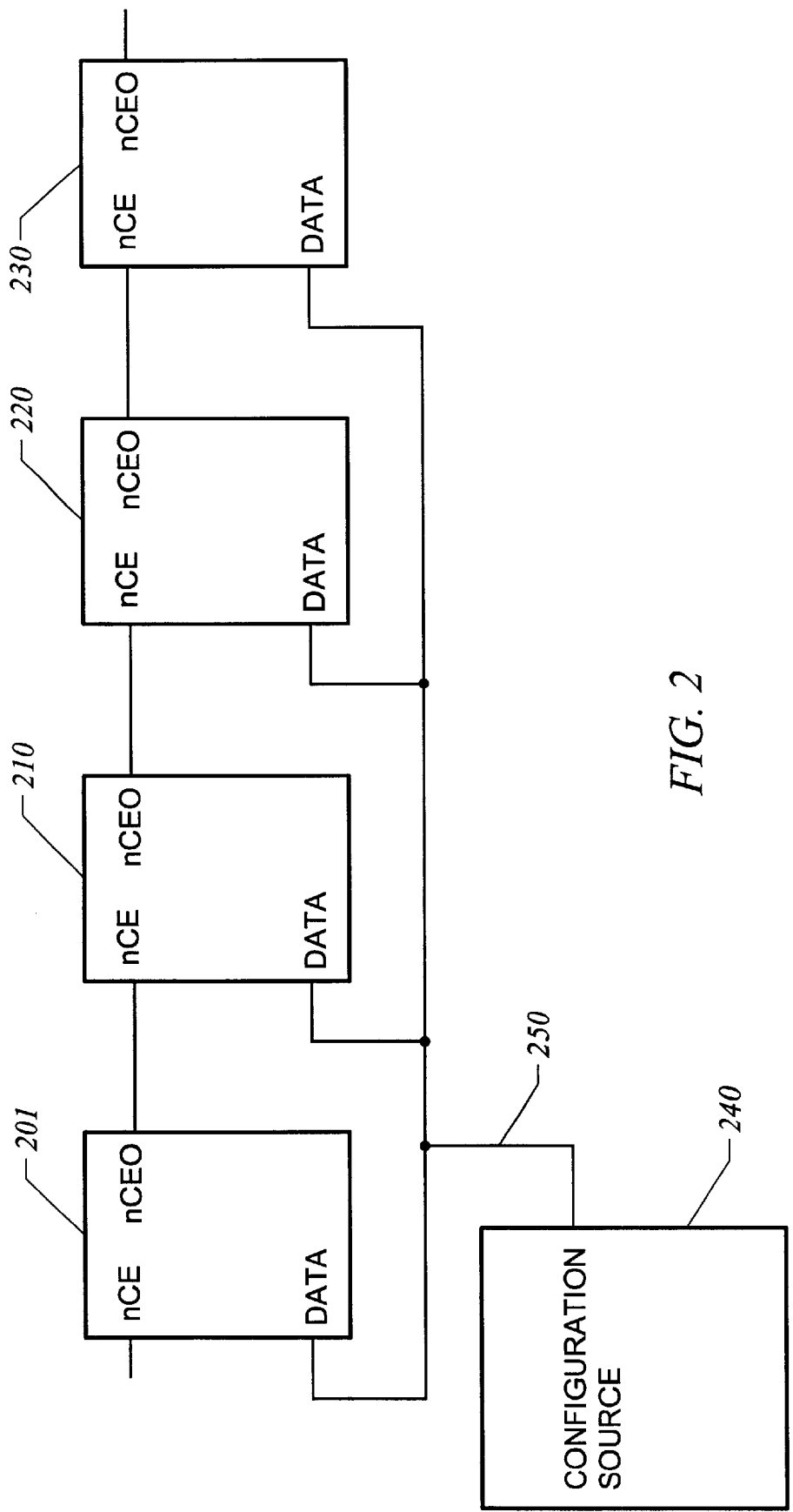
FIG. 2 shows an implementation of cascaded programming for programmable integrated circuits.

FIG. 2 shows a technique for cascaded configuration (or programming) of programmable devices 201, 210, 220, and 230 (e.g., PLDs) from a configuration source 240. The configuration data is stored or transferred from configuration source 240 to DATA pins of the PLDs by a connection 250. The transfer may be in parallel or serial format. The configuration source may be, for example, a nonvolatile memory such as an EPROM, EEPROM, Flash memory, serial EPROM, or other similar storage devices. In some embodiments, the configuration source may be other devices such as a microprocessor, microcontroller, or DRAM. Although a specific number of programmable devices is shown in FIG. 2, any number of programmable integrated circuits may be configured using this technique. For example, two, three, four, five, and more devices may be configured using this approach. Additional devices may be added by attaching these devices in a similar fashion as programmable devices 201, 210, 220, and 230.

FIG. 2 shows an embodiment of cascaded configuration where the configuration source is connected to the devices to be configured, programmable devices 201, 210, 220, and 230. The configuration data is passed directly from the configuration source to the PLDs, without passing through another PLD.

In other embodiments of cascaded configuration, however, the configuration data may be passed through other PLDs. For example, in FIG. 3, programmable devices 301, 310, 320, and 330 (e.g., PLDs) are connected to a configuration source 340 in similar fashion as in FIG. 2. However, data is passed from the configuration source through a connection 350 to a DATA pin of device 301. Likewise, configuration data is passed through a DATA OUT pin of device 301 and a connection 355 to a DATA pin of device 310. Configuration data is passed through device 301 and a DATA OUT pin of device 310 and a connection 365 to a DATA pin of device 320. And, configuration data is passed through devices 301 and 310 and 320 and a DATA OUT pin of device a connection 370 to a DATA pin of device 330. Any number of programmable integrated circuits may be configured using the technique illustrated in FIG. 3. Additional devices may be configured by adding to the serial chain of devices.

Figure 3:
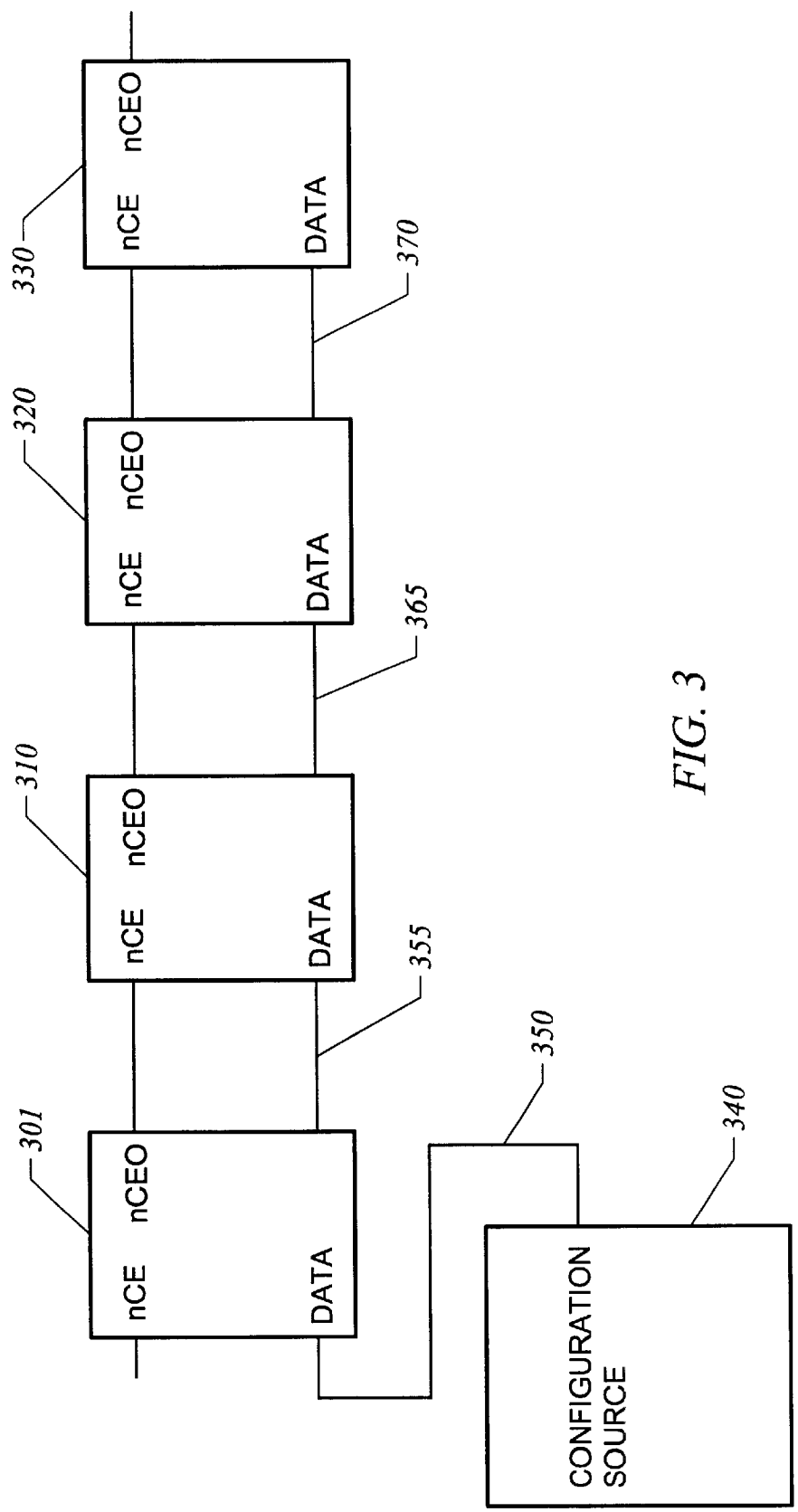
FIG. 3 shows another implementation of cascaded programming for programmable integrated circuits.

As shown in FIGS. 2 and 3, each programmable integrated circuit has nCE and nCEO pins, which are used for handshaking. The nCE (chip enable) and nCEO (chip enable output) pins are dedicated pins allocated for handshaking during cascaded configuration. For programmable integrated circuits, the nCE and nCEO pins may be in the same pin location for a given package size. For example, in a 225-pin BGA package, the nCE and nCEO pins may be pins C1 and D1. These same pins may be used for a "family" of programmable products in order to provide users with a "standard" pin-out. For example, pins C1 and D1 may be use for handshaking for different parts in the FLEX® 8000 family when using the 225-pin BGA package.

To briefly describe the handshaking operation, an nCE pin of a programmable device receives a START signal indicating that the programmable device should configure itself with the configuration data at its DATA input. After configuration is completed, the programmable device will output a DONE signal at its nCEO pin. The nCEO pin is connected to the nCE pin of the next programmable device to be programmed. The DONE signal is used by the next programmable device as a START signal. After receiving this START signal, the next programmable device then begins configuring itself with the configuration data at its DATA input. The handshaking operation is similar for the cascaded configuration implementations in FIGS. 2 and 3. As described above, a difference between FIGS. 2 and 3 is how the data is passed from the configuration source to the programmable devices.

On a programmable integrated circuit, some pins are dedicated for a particular purpose and other pins (i.e., I/O pins) are for input and output of logical data. For example, dedicated pins may be for testing or configuring a PLD. The nCE and nCEO pins are a specific example of dedicated pins on a PLD. As described above, the nCE and nCEO pins are used for the purpose of handshaking during cascaded configuration. In contrast, I/O pins are used to input and output user data. Dedicated pins cannot generally be used for user I/O. Therefore, the number of dedicated pins reduces the pins available for user I/O. Saving even a single dedicated pin, and using this pin instead for user I/O, may provide a great cost savings. For example, saving a single dedicated pin may avoid the use of the next larger package size.

In a programmable integrated circuit, there are dedicated pins such as nCE and nCEO used during a configuration or programming mode. A technique to increase the number of user I/O pins is to allow the nCE and nCEO dedicated pins to be user I/O pins when not being used for cascaded configuration operation. This would increase the available number pins for user I/O. Another example of a pin which may be used for user I/O when not needed as a dedicated pin is the DATA OUT pin (shown in FIG. 3 and described above). Specifically, when cascaded configuration is not used, or when cascaded configuration is used but data is not passed through PLDs, the DATA OUT pin is not needed. The DATA OUT pin may instead be used for user I/O. Further, the DATA OUT pin for the last device in the chain (i.e., device 330) may, in the typical case, be used for user I/O. Although described with respect to programmable integrated circuit such as PLDs, the techniques of the present invention are also applicable to other types of integrated circuits such as ASICs, microprocessors, and memories where it is desirable to reduce the number of dedicated pins and instead use these pins for user I/O. Furthermore, similar techniques may be used for other dedicated pins (other than the nCE and nCEO pins) on the integrated circuit.

There are cases where the nCE or nCEO pins, or both, are not used. In these cases, the nCE or nCEO pins, or both, may be made available as user I/O pins. The nCE and nCEO pins are not used during normal mode operation (i.e., the user mode) since the programmable device is not being configured.

Figure 4:
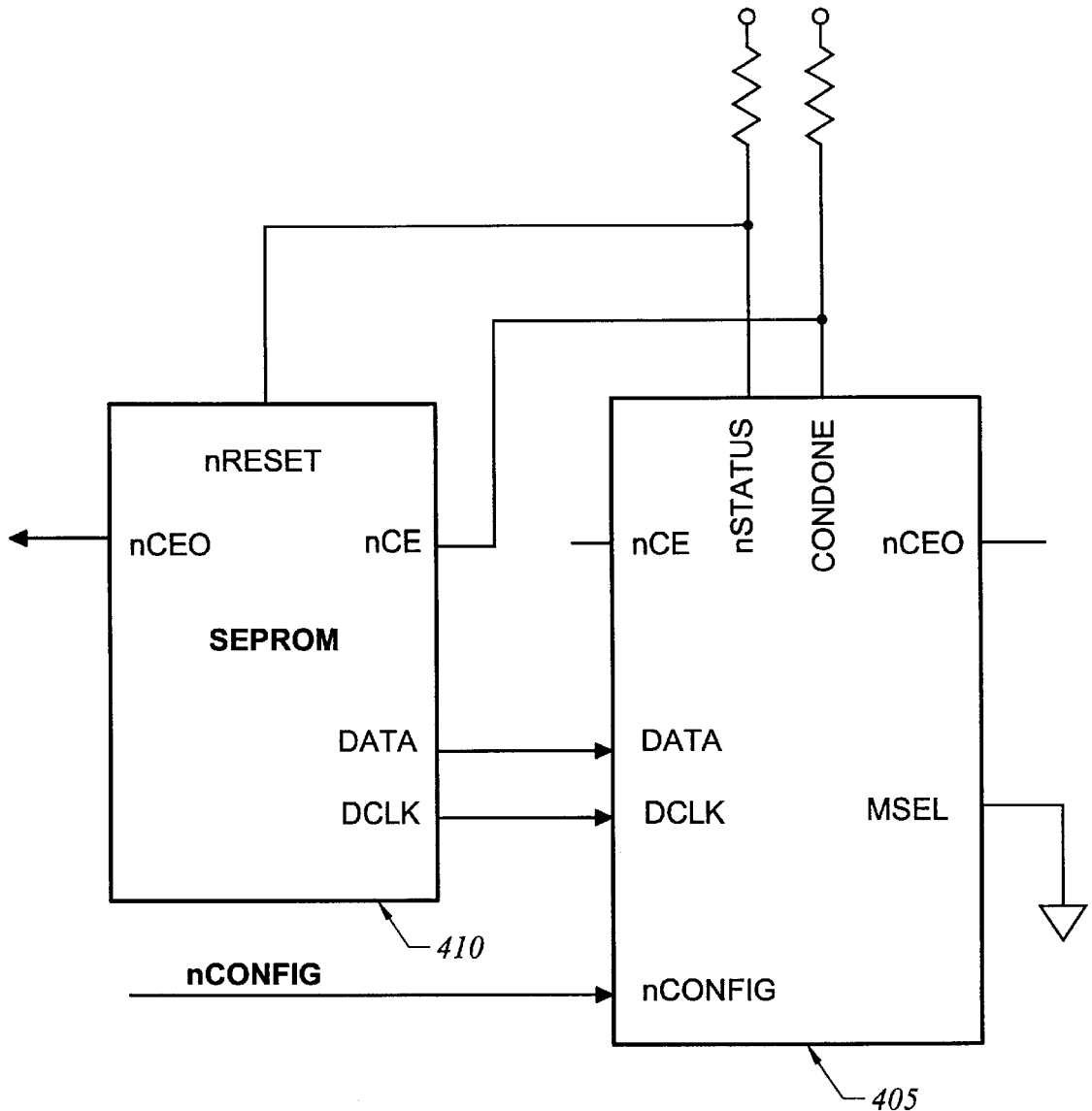
FIG. 4 shows an implementation for configuring a single programmable integrated circuit.

The nCE and nCEO do not need to be used when configuring a programmable device, and not using cascaded configuration. An example of this is shown in FIG. 4. FIG. 4 shows a single PLD 405 configured using data from a configuration source, a serial EPROM 410. In this case, device 405 will start programming regardless of the state of nCE. And the nCEO pin does not need to be activated since there is not any other devices to be configured. Therefore, both the nCE and nCEO pins may be treated as regular I/O pins during programming, and the user mode.

The nCEO pin does not need to be activated for the last device to be configured (e.g., device 230 in FIG. 2 and device 330 in FIG. 3) when using cascaded configuration. Since this is the last device that will be configured, the nCEO does not need to produce a signal is start configuration of another device. Therefore, the nCEO pin for the last device to be configured during cascaded configuration may be used as a regular I/O pin during programming.

The nCE pin does not need to be activated for the first device to be programmed (e.g., device 201 in FIG. 2 and device 301 in FIG. 3) when using cascaded configuration. Since this is the first device to be configured, the configuration of the device may begin regardless of the state of the nCE pin. Therefore, the nCE pin may be used as a regular I/O pin during programming.

Using the techniques of the present invention, the nCE or nCEO pins, or both, will be made available as user I/O pins during the situations described above. This will effectively increase the number of I/O pins per package. As discussed above, the techniques of the present invention may also be used with dedicated pins other than nCE and nCEO to increase the number of user I/O pins. Generally, the dedicated pin will act as a dedicated pin for its intended purpose. The same dedicated pin, however, will be configured as I/O pins when that purpose has been completed, or that purpose is not used or needed.

Furthermore, in order to prevent bus contention in the configuration mode, user I/O pins may be tristated. Then, a user I/O pin may be driven high or low. This may be especially useful in the case of in-system programming (ISP), when the device is programmed while it remains on the printed circuit board. An nCE, nCEO, or DATA OUT pin which is configured to be a user I/O pin may similarly be placed in tristate (as are other user I/O pin) during the configuration mode to prevent bus contention.

Figure 5:
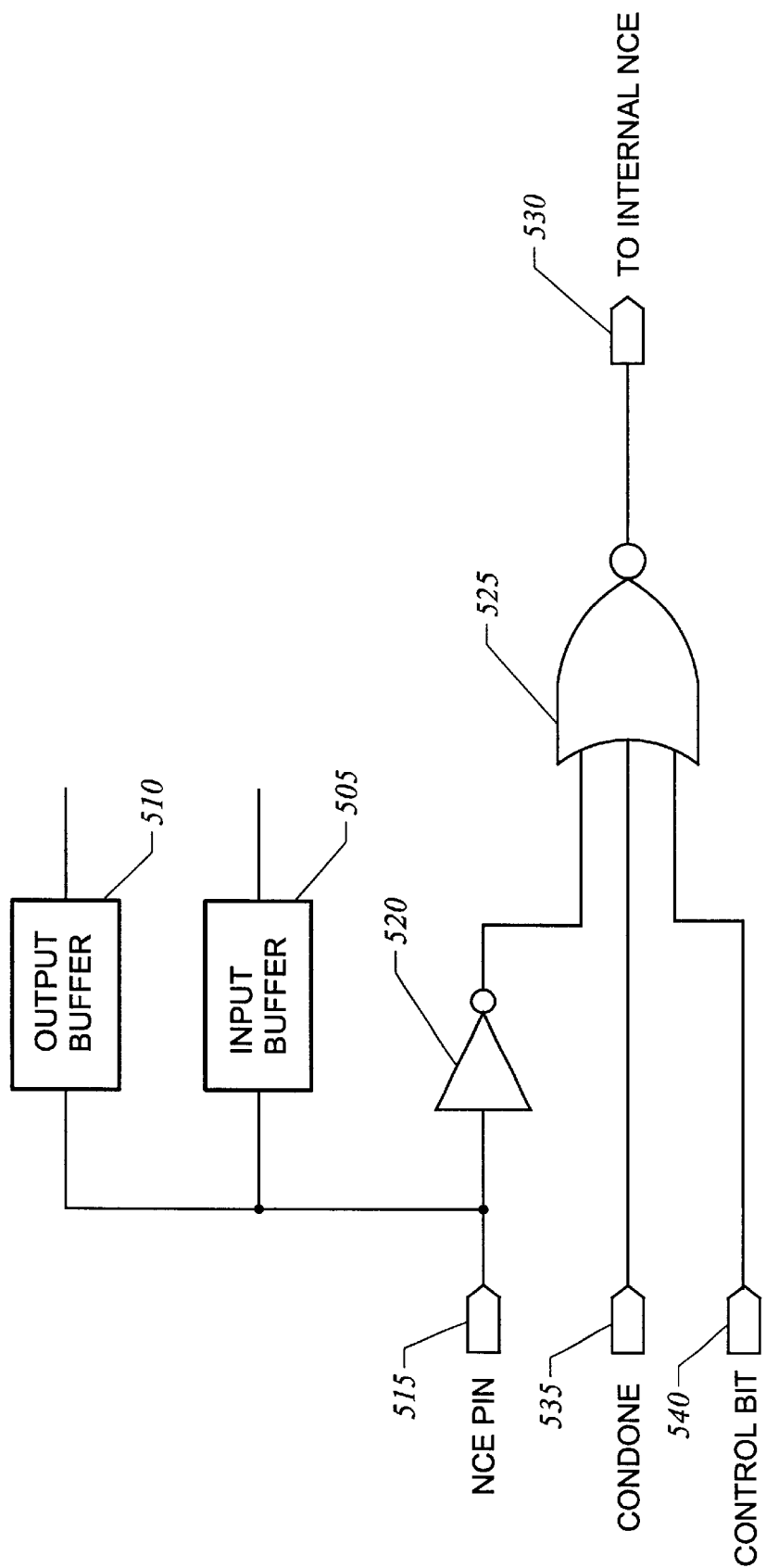
FIG. 5 shows circuitry to implement an input pin having a multiple purposes including that of a user I/O pin.

FIG. 5 shows a specific embodiment of circuitry to implement the technique of the present invention. The circuitry in FIG. 5 is used to implement a pin configurable as nCE or user I/O. This circuitry is contained within the device or integrated circuit to have this feature (e.g., a PLD) of a dual function input pin. The present invention may be used in the implementation of other specific or special purpose pins, and nCE (and nCEO) is being discussed to give a specific example. An input buffer 505 and output buffer 510 are coupled to the dedicated pin or pad, which is in this case, nCE 515. The input and output buffers will provide functionality as user I/O at this pin when configured to be an I/O.

Pin 515 is further coupled to an inverter 520 and a NOR gate 525. An output 530 of NOR gate 525 is coupled to internal circuitry used to implement the circuitry for the dedicated pin. In this particular embodiment, since pin 515 is for nCE, output 530 is coupled to the internal nCE circuitry. If either a CONDONE input 535 or CONTROL BIT input 540 to the NOR gate is a logic high or "1," nCE pin 515 will be disconnected from the internal nCE circuitry. Then, pin 515 may be used as regular I/O pin.

The use of CONDONE is a example of a hardware control technique of releasing the dedicated input pin (when no longer needed as a dedicated input pin) for use as a regular I/O pin. CONDONE is an internal signal indicating when configuration has been completed. During configuration, CONDONE is a logic low or "0." When configuration of the programmable device is completed, CONDONE will become a logic high, and the nCE pin will no longer be used for handshaking. NOR gate 525 outputs a logic low to the internal nCE circuitry, indicating that this programmable device will not be configured (since it has already been configured).

By using of CONDONE, pin 515 may be used as an I/O pin when configuration has been completed in both the user and configuration modes. For example, during the user or normal mode (when the device is not being configured), CONDONE is high, and pin 515 may be an I/O pin. Also, after configuration has been completed during the configuration or programming mode, CONDONE will become high, and pin 515 may be an I/O pin.

CONTROL BIT is a input used by the user (or customer) to indicate whether the device is in cascaded configuration or not in cascaded configuration. When CONTROL BIT is a logic high, the device will not be used in cascaded configuration. When CONTROL BIT is a logic low, the device will be used in cascaded configuration. When cascaded configuration is enabled, the nCE pin 515 will be coupled to the internal nCE circuitry. When cascaded configuration is not enabled, the nCE pin 515 is decoupled from the internal nCE circuitry. Then, pin 515 will be available for use as an I/O pin.

CONTROL BIT 540 may be configured in various ways. For example, CONTROL BIT 540 may be set by software control depending on a customer input set in a programming data file. The programming data file is commonly known as a POF file. The POF file contains the configuration data which is to be programmed into the programmable integrated circuit. This may be stored in the configuration source 240 (e.g., serial EPROM). The state of the CONTROL BIT 540 may transferred from the POF file or configuration source and stored in a register or flip-flop. CONTROL BIT 540 may also be set by an option register bit.

In an alternative embodiment, the CONTROL BIT 540 may be configured by programming or configuring a programmable bit, such as a fuse (programmed by a laser, metal option, or other technique), antifuse cell, nonvolatile cell, or other logical storage cells.

There are many different ways to implement the logic in FIG. 5. FIG. 5 shows just one of the many different logical implementations. For example, the logic in FIG. 5 may be implemented using AND-OR-INVERT logic, AND gates, NAND gates, NOR gates, XOR gates, pass gates, multiplexers, and combinations of these logic structures. As a further example, NOR gates 525 may be implemented using two 2-input NOR gates.

Furthermore, FIG. 5 shows the use of both CONDONE and CONTROL BIT 540 to control whether dedicated pin 515 is released to be use as an I/O pin. In this case, the control of the circuitry accomplished by both software and hardware control. However, in alternative embodiments of the present invention, the circuitry may be software or hardware controlled, and not necessarily both. For example, in a hardware-control-only embodiment, only pin 515 and CONDONE 535 are coupled to input NOR gate 525. In a software-control-only embodiment, only pin 515 and CONTROL BIT 540 are coupled to input NOR gate 525.

Furthermore, input buffer 505 and output buffer 510 will be disabled when pin 515 is configured to be the nCE pin. This will ensure the use of pin 515 for nCE does not interfere with the circuitry for user mode operation.

Figure 6:
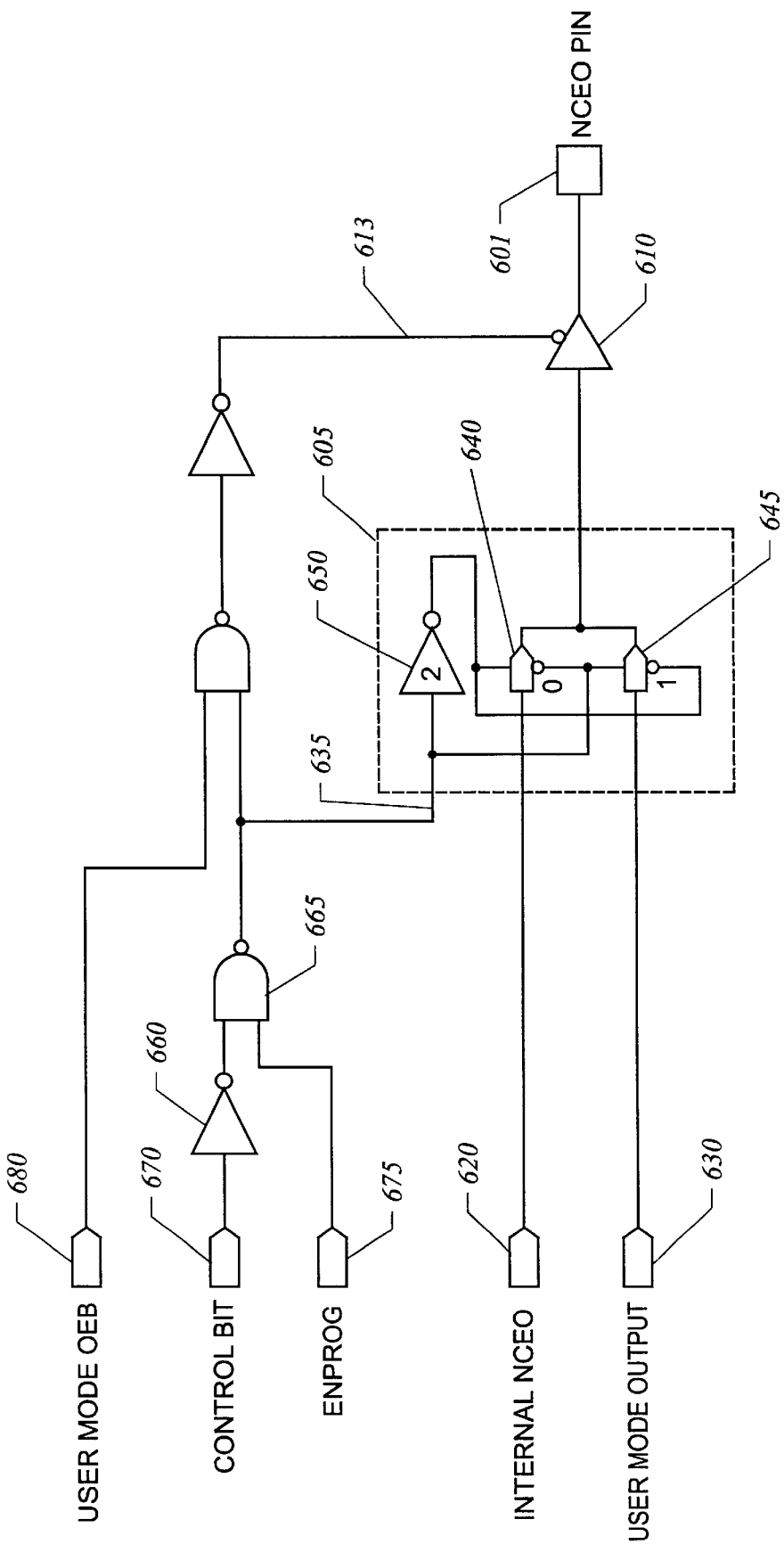
FIG. 6 shows circuitry to implement an output pin having multiple purposes including that of a user I/O pin.

FIG. 6 shows an implementation of circuitry used to implement a dual-function dedicated output pin 601, such as nCEO or DATA OUT. For example, pin 601 may be used as the nCEO or DATA OUT pin when needed, and a regular I/O pin otherwise. This circuit may be use in an integrated circuit such as a PLD where this feature is desired.

The circuitry includes a multiplexer 605 coupled to a tristate buffer 610. The tristate buffer determines whether an output from multiplexer 605 is output to pin 601, or if pin 601 will be in a tristate mode (i.e., high impedance state). The tristate buffer has a control input 613. When control input 613 is a low, tristate buffer 610 is enabled. The tristate buffer will pass an output from multiplexer 605 to pin 601. When control input 613 is a high, tristate buffer 610 is disabled, and pin 601 will be at the high impedance state.

Multiplexer 605 has a first input coupled to an internal dedicated pin logic 620 (such as internal nCEO or DATA OUT logic) and a second input coupled to a user or normal mode output 630. The first input is coupled to the logic used to implement the internal dedicated pin logic functionality. For example, in the case of nCEO logic, the circuitry would generate the DONE signal to generated at the nCEO pin.

The second input is the user mode output used to output data as does a regular I/O pin. Pin 601 may also be coupled to an input buffer (not shown) which would allow regular I/O pin functionality. If an embodiment where pin 601 is not coupled to an input buffer, then pin 601 would be an output pin only. Then, pin 601 would output, for example, nCEO or user output.

Multiplexer 605 has a control input 635. When control input 635 is high, the user mode output is selected for output. When control input 635 is low, the input dedicated pin logic 620 is selected for output.

FIG. 6 shows an implementation of multiplexer 605 where transmission gates 640 and 645 and an inverter 650 are used. In this specific embodiment, transmission gates 640 and 650 are implemented using NMOS and PMOS pass transistors arranged in parallel. The inverter is connected to control input 635 and generates a complement of the control signal (i.e., control input bar). Control input 635 is coupled to the PMOS transistor of transmission gate 640 and the NMOS transistor of transmission gate 645. The control input bar is coupled to the NMOS transistor of transmission gate 640 and the PMOS transistor of transmission gate 645.

Although one embodiment has been shown, in practice, there are many other ways to implement multiplexer 605 and a multiplexing function. For example, in an alternative embodiment, multiplexer 605 may be implemented using logic gates such as NAND gates and NOR gates.

The logic used to control multiplexer control input 635 is an inverter 660 and NAND gate 665. A CONTROL BIT input 670 is coupled to inverter 660 to a first input of NAND gate 665. An ENPROG input 675 is coupled to a second input of NAND gate 665.

CONTROL BIT 670 is somewhat analogous in functionality to CONTROL BIT 540 described above and shown in FIG. 5. ENPROG 675 is somewhat analogous in functionality to CONDONE 535 described above and shown in FIG. 5.

CONTROL BIT 670 is a input used by the user (or customer) to indicate whether the device is in cascaded configuration or not in cascaded configuration. When CONTROL BIT 670 is a logic high, the device will not be used in cascaded configuration. When CONTROL BIT is a logic low, the device will be used in cascaded configuration. When cascaded configuration is enabled, input 620 will be coupled to pin 601. When cascaded configuration is not enabled, input 620 is decoupled from the pin 601. User mode output 630 will be coupled to pin 601. Hence, pin 601 may be use a regular I/O pin.

The discussion above with regard CONTROL BIT 540 may be applied similarly to CONTROL BIT 670. In a specific embodiment, CONTROL BIT 670 is the same as the signal used for CONTROL BIT 540 in FIG. 5. As in the case for CONTROL BIT 540, CONTROL BIT 670 is an example of software control of releasing the dedicated pin 601 to be used as a regular I/O pin.

ENPROG will be a logic high during programming, and will go low after the cascaded device has been configured or programmed. During the normal mode, ENPROG will be low. ENPROG enables similar functionality as discussed above for CONDONE 535 (shown in FIG. 5). The discussion above with regard to CONDONE may be applied similarly to ENPROG. ENPROG is a example of a hardware control technique of releasing the dedicated pin (when no longer needed as a dedicated pin) for use as a regular I/O pin.

As described above, specific implementations may include software control or hardware control, or both (as shown in FIG. 6).

Furthermore, during configuration or programming, a user mode OEB input 680 will be a logic high. During configuration, if the user chooses to cascade, then input 620 is selected for output, and tristate buffer 610 will be enabled. If the user chooses not to use cascade, tristate buffer 610 will not be enabled during configuration. In this case, the user can drive pin 601 to any state during configuration, similar to the case as normal user I/O pins, thus making pin 601 easier for the user to use. After configuration is completed, or when in the user mode, user mode OEB will be controlled by the logic implemented by the user. Tristate buffer 610 will be enabled or disabled as the user expects due to the logic the user configured within the programmable integrated circuit.

The present invention may be used within a programmable integrated circuit that is configured or to be configured via in-system programming (ISP). In-system programming is a technique where the programmable integrated circuit is configured while it remains resident on a printed circuit board or PC board. The present invention is particularly useful for ISP programming since the dedicated handshaking pins may be returned to used as I/O pins immediately after configuration.

The present invention may be used in conjunction and is compatible with other techniques to effectively increase the available number of user I/O pins, such as described in U.S. patent application Ser. No. 09/094,186, filed Jun. 9, 1998 incorporated herein by reference.

The foregoing description of preferred embodiments of the invention has been presented for the purposes of illustration and description. It is not intended to be exhaustive or to limit the invention to the precise form described, and many modifications and variations are possible in light of the teaching above. The embodiments were chosen and described in order to best explain the principles of the invention and its practical applications to thereby enable others skilled in the art to best utilize and practice the invention in various embodiments and with various modifications as are suited to the particular use contemplated. It is intended that the scope of the invention be defined by the following claims.

What is claimed is:

1. A method of configuring programmable devices comprising: providing a source of configuration data;
    indicating a first I/O pin of a first programmable device is to be used to output a handshaking signal during a configuration mode of the first programmable device, wherein the first programmable device is coupled to the source of configuration data;
    indicating a second I/O pin of a second programmable device is to be used to receive the handshaking signal from the first programmable device during a configuration mode of the second programmable device;
    configuring the first programmable device with configuration data transferred serially from the source; and
    configuring the second programmable device in response to the handshaking signal from the first I/O pin of the first programmable device and received at the second I/O pin of the second programmable device with configuration data from the source.

2. The method of claim 1 further comprising:
    after the first programmable device has been configured, permitting the first I/O pin to be used as a user I/O pin.

3. The method of claim 2 further comprising:
    after the second programmable device has been configured, permitting the second I/O pin to be used as a user I/O pin.

4. The method of claim 2 wherein software control is used to configure the first I/O pin to output the handshaking signal.

5. The method of claim 1 further comprising:
    configuring a third I/O pin of the first programmable device to be used for user I/O instead of receiving a handshaking signal.

6. The method of claim 1 wherein configuration data is passed directly from the source to the first and second programmable devices.

7. The method of claim 1 wherein configuration data is passed from the source through the first programmable device to the second programmable device.

8. The method of claim 1 wherein the first programmable device comprises Flash memory.

9. The method of claim 1 wherein the first programmable device comprises SRAM cells.

10. The method of claim 1 wherein the first programmable device comprises nonvolatile memory.

11. The method of claim 1 wherein the first programmable device is a microprocessor.

12. The method of claim 1 wherein the first programmable device is a microcontroller.

13. The method of claim 1 wherein the first programmable device comprises DRAM.

14. A programmable integrated circuit comprising:
   first electronic circuitry to configure a first pin as a configuration input pin in a first state and a user I/O pin in a second state; and
   second electronic circuitry to configure a second pin as a configuration output in in the first mode and a user I/O pin in the second state, wherein the first state is a configuration mode and the second state is a normal operation mode of the programmable integrated circuit.

15. The programmable integrated circuit of claim 14 wherein the first circuitry comprises:
   a NOR gate having a first input coupled to the first pin and a second input coupled to a state signal configuring the first pin will be in the first or second state;
   an input buffer coupled to the first pin; and
   an output buffer coupled to the first pin.

16. The programmable integrated circuit of claim 14 wherein the second circuitry comprises:
   a multiplexer having a first input coupled to a configuration output logic circuit and a second input coupled to a user mode output circuit; and
   a tristate buffer coupled between an output of the multiplexer and the second pin.

17. The programmable integrated circuit of claim 16 wherein a state signal is coupled to control inputs of the multiplexer and tristate buffer, and when the state signal indicates the first state, the multiplexer selectively couples the configuration output logic circuit to the tristate buffer, and the tristate buffer is enabled.

18. The programmable integrated circuit of claim 14 wherein the programmable integrated circuit is in the first state during cascaded configuration.

19. The programmable integrated circuit of claim 14 wherein in the first state, the first and second pins may be used for a handshaking operation.

20. A method of configuring programmable devices comprising:
   providing in a first programmable device a first pin configurable as a special purpose pin or a user I/O pin;
   providing in a second programmable device a second pin configurable as a special purpose pin or a user I/O pin;
   during a first mode, configuring the first pin as a special purpose pin to output a handshaking signal;
   during the first mode, configuring the second pin as a special purpose pin to receive the handshaking signal from the first pin;
   configuring the first and second programmable devices;
   in a second mode, configuring the first pin as a user I/O pin; and
   in a second mode, configuring the second pin as a user I/O pin.

21. The method of configuring programmable devices of claim 20 wherein the first and second and programmable devices have been configured before the second mode begins.

22. The method of configuring programmable devices of claim 20 wherein configuring the first and second programmable devices comprises:
   providing a source of configuration data;
   transferring the configuration data from the source to the first programmable device;
   configuring the first programmable device with the configuration data;
   transferring the configuration data from the source to the second programmable device; and
   configuring the second programmable device with the configuration data.

23. The method of configuring programmable devices of claim 22 wherein configuration data is passed from the source to the second programmable device through the first programmable device.

24. The method of configuring programmable devices of claim 22 wherein the source is a serial nonvolatile memory.

25. A method of configuring programmable devices comprising:
   providing a first programmable device to be configured, wherein the first programmable device has a pin configurable as a special purpose pin or a user I/O pin;
   configuring the pin to function as special purpose pin indicated by a user using a software programming data file;
   providing a source of configuration data;
   providing a second programmable device to be configured, coupled to receive a signal from the special purpose pin;
   transferring configuration data from the source to the first programmable device; and
   configuring the first programmable device with the configuration data.

26. The method of configuring programmable devices of claim 25 further comprising:
   transferring configuration data from the source to the second programmable device; and
   configuring the second programmable device with the configuration data.

27. The method of configuring programmable devices of claim 26 wherein the configuration data is passed from the source through the first programmable device.

28. The method of configuring programmable devices of claim 25 wherein the configuration data is serially transferred from the source to the first programmable device.

29. The method of configuring programmable devices of claim 25 wherein the source is a serial EPROM.

30. The method of configuring programmable devices of claim 25 wherein the special purpose pin is used in a handshaking operation when configuring the first programmable device.

31. The method of configuring programmable devices of claim 25 further comprising:
   configuring the pin to be a user I/O pin after the first programmable device has been configured.

32. The method of configuring programmable devices of claim 25 further comprising:
   configuring the pin to be a user I/O pin during a normal mode of operation for the first programmable device.

33. A method of configuring programmable devices comprising:

providing a source of configurations data;

from the configuration data, determining whether a programmable device to be programmed will have a pin to be used for handshaking;

if handshaking is indicated, configuring the pin to provide or receive a signal for handshaking with another programmable device;

if handshaking is not indicated, configuring the pin to operate as a normal I/O pin.

34. The method of configuring programmable devices of claim 33 wherein when handshaking is not indicated, the pin operates as a normal I/O pin in a configuration mode of the programmable device.

35. The method of configuring programmable devices of claim 33 wherein when handshaking is not indicated, the pin operates as a normal I/O pin in a configuration and a user mode of the programmable device.

36. The method of configuring programmable devices of claim 33 wherein when handshaking is indicated, the programmable device is configurable while cascaded with the other programmable device.

37. A method of configuring programmable devices comprising:

providing a source of configuration data;

transferring first a portion of the configuration data from the source to a first programmable device to be configured;

configuring a pin of the first programmable device to function as a configuration data output pin; and transferring a second portion of the configuration data from the source through the first programmable device to a second programmable device to be configured using the configuration data output pin.

38. The method of configuring programmable devices of claim 37 wherein in a user mode, the pin is configured to function as a user I/O pin.

39. A programmable integrated circuit comprising:

a first pin to receive a first bit to indicate whether a second pin is to be used as a programming mode pin or as a user mode pin;

a multiplexer coupled to a programming mode circuit and a user mode circuit, and having an output coupled to the second pin;

a multiplexer control circuit coupled to the first bit, wherein when the first bit is in a first state, the multiplexer couples the programming mode circuit to the second pin, and when the first bit is in a second state, the multiplexer couples the user mode circuit to the second pin; and a tristateable buffer, coupled between the multiplexer and the second pin, wherein the first bit is coupled to control enabling of the tristateable buffer.

40. The programmable integrated circuit of claim 39 wherein the multiplexer control circuit comprises:

a logic gate, coupled to the first bit, having an output coupled to a control input of the multiplexer.

41. The programmable integrated circuit of claim 39 wherein when the first bit is in the first state, the tristateable buffer is enabled.

42. The programmable integrated circuit of claim 39 further comprising:

a logic gate, coupled to the first bit, having an output coupled to the tristateable buffer, wherein when the first bit is in a first state, the tristateable buffer is enabled.

43. The programmable integrated circuit of claim 42 wherein when the first bit is in a second state, enabling of the tristateable buffer is controlled by a second bit.

44. The programmable integrated circuit of claim 39 wherein the multiplexer comprises:

a first pass gate and a second pass gate coupled to the output of the multiplexer, wherein the first pass gate is further coupled to the programming mode circuit, and the second pass gate is further coupled to the user mode circuit.

45. The programmable integrated circuit of claim 44 wherein the first pass gate comprises an NMOS transistor and a PMOS transistor.

46. A programmable integrated circuit comprising:

control bit to indicate whether a first pin is to be used as a programming mode pin or as a user mode pin; and a logic circuit coupled between the first pin and a programming mode circuit, wherein the control bit is coupled to the logic circuit so when the control bit is in a first state, a state of the first pin determines a logic state received by the programming mode circuit, and when the control bit is in a second state, the programmable mode circuit receives a logic state not dependent on the state of the first pin, wherein a state of the control bit will be indicated by a user in a software programming data file.

47. The programmable integrated circuit of claim 46 wherein the logic circuit comprises a NAND gate.

48. The programmable integrated circuit of claim 46 wherein the first pin is further coupled to a user mode circuit.

49. The programmable integrated circuit of claim 46 wherein the first pin is further coupled to an input buffer.

50. The programmable integrated circuit of claim 46 wherein the first pin is further coupled to an output buffer.

* * * * *

UNITED STATES PATENT AND TRADEMARK OFFICE
CERTIFICATE OF CORRECTION

PATENT NO.    : 6,314,550 B1
DATED         : November 6, 2001
INVENTOR(S)   : Wang et al.

It is certified that error appears in the above-identified patent and that said Letters Patent is hereby corrected as shown below:

<u>Title page,</u>
Item [75], Inventors, delete "Khai Huang" and insert therefore -- Joseph Huang --.

Signed and Sealed this

Twenty-fourth Day of December, 2002

JAMES E. ROGAN
*Director of the United States Patent and Trademark Office*

UNITED STATES PATENT AND TRADEMARK OFFICE
CERTIFICATE OF CORRECTION

PATENT NO.        : 6,314,550 B1                                    Page 1 of 1
APPLICATION NO.   : 09/094226
DATED             : November 6, 2001
INVENTOR(S)       : Wang et al.

It is certified that error appears in the above-identified patent and that said Letters Patent is hereby corrected as shown below:

Title page,
Item [75], Inventors, delete "Khai Huang" and insert therefore --Joseph Huang--.

In line 6 of claim 14, column 11, line 21, please delete "in in" and insert --pin in--.

In line 6 of claim 14, column 11, line 21, please delete "mode" and insert --state--.

In line 2 of claim 15, column 11, line 26, please delete "circuitry" and insert --electronic circuitry--.

In line 5 of claim 15, column 11, line 29, please delete "will be" and insert --to be--.

In line 2 of claim 16, column 11, line 33, please delete "circuitry" and insert --electronic circuitry--.

In line 2 of claim 46, column 14, line 32, please delete "control" and insert --a control--.

Signed and Sealed this

Eighth Day of April, 2008

JON W. DUDAS
*Director of the United States Patent and Trademark Office*